United States Patent [19]

Hall

[11] Patent Number: 5,567,969
[45] Date of Patent: Oct. 22, 1996

[54] COMPOUND MODULATED INTEGRATED TRANSISTOR STRUCTURE WITH REDUCED BIPOLAR SWITCH BACK EFFECT

[76] Inventor: John H. Hall, 3169 Payne Ave., San Jose, Calif. 95117

[21] Appl. No.: 425,173

[22] Filed: Apr. 20, 1995

[51] Int. Cl.[6] ........................ H01L 29/76; H01L 29/94; H01L 31/062; H01L 27/095
[52] U.S. Cl. ..................... 257/370; 257/369; 257/378; 257/474; 257/477
[58] Field of Search .................................. 257/370, 378, 257/474, 477, 369

[56] References Cited

U.S. PATENT DOCUMENTS

| | | | |
|---|---|---|---|
| 4,920,399 | 4/1990 | Hall | 357/42 |
| 5,021,858 | 6/1991 | Hall | 357/42 |
| 5,060,044 | 10/1991 | Tomassetti | 257/370 |
| 5,168,341 | 12/1992 | Kumagai et al. | 257/370 |

Primary Examiner—Steven H. Loke
Attorney, Agent, or Firm—Townsend and Townsend and Crew; Henry K. Woodward

[57] ABSTRACT

Disclosed is an integrated transistor structure having increased conductance and operating speed including a complementary insulated gate field effect transistor pair, each including a source and a drain region with a gate contact positioned therebetween, ohmic contacts to the sources, and a rectifying junction contact to each of the drain regions. The gates of the two transistors are interconnected and function as the input terminal, and the two rectifying contacts are interconnected as the output of the device. The structure includes a semiconductor substrate having slow diffusant dopants therein or implanted metal ions of cobalt, molybdenum, or tungsten. The structure further includes an epitaxial semiconductor layer with resistance on the order of 0.5 to 1.0 ohm cm and a thickness of 1.5 to 5.0 μm. The device regions for the field effect transistor pair are formed in the epitaxial semiconductor layer. Current from a positive voltage source is applied through the substrate to the source of a P-channel field effect transistor, thereby reducing switch back effect.

12 Claims, 2 Drawing Sheets

COMPOUND MODULATED INTEGRATED TRANSISTOR STRUCTURE WITH REDUCED BIPOLAR SWITCH BACK EFFECT

BACKGROUND OF THE INVENTION

This invention relates generally to semiconductor devices, and more particularly the invention relates to an integrated transistor logic device utilizing a compound transistor formed from a CMOS transistor pair operating in conjunction with bipolar transistors formed within the drain regions to increase transconductance and switching speed.

The CMOS transistor pair is widely used in integrated circuit logic applications. However, a limitation of such devices is speed of operation. U.S. Pat. No. 4,920,399 for Conductance Modulated Integrated Transistor Structure and U.S. Pat. No. 5,021,858 for Compound Modulated Integrated Transistor Structure disclose and claim modifications of the CMOS transistor pair structure to include a region of opposite conductivity within the drain region or a Schottky contact to the drain region which acts as a minority carrier injector. In effect, the drain region forms a base region, the injector region forms the emitter, and the buried layer of the integrated structure forms the collector of a bipolar transistor. The resulting merged emitter BICMOS structure has a much higher transconductance with no increase in input capacitance resulting in an increase in operating speed.

However, there exists a limitation in the design and production tolerances of the integrated transistor structures. The NPN bipolar transistor, which is merged to the drain of the P channel MOS transistor, suffers from an electrical switch back effect which limits the operating voltage and current of the NPN transistor and the resulting circuit application. The problem is caused primarily by the top surface contact for feeding the positive power supply through the collector resistance of the NPN bipolar transistor which is made up of the buried layer resistance in the integrated structure (caused by the resistivity and length of the buried layer), the series resistance of the epitaxial collector, and the epitaxial contact resistance between the plus voltage contact and the buried layer. This resistance can be comparatively large and variable which severely limits the applications of the transistor structure.

The present invention is directed to minimizing the bipolar switch back effect by reducing the collector resistance.

SUMMARY OF THE INVENTION

Briefly, the epitaxial structure employing buried layers of the prior art merged emitter BICMOS integrated structure is replaced by a heavily doped substrate which has been doped with a slow diffusant such as antimony or arsenic or which has been implanted with a metal such as cobalt, molybdenum, or tungsten to form a high conductivity electrode. Such doping of the substrate reduces out diffusion of dopant into the overlying epitaxial layer. This substrate electrode supplies the positive current for the circuit cells of the integrated circuit.

A thin epitaxial layer of silicon with a resistivity on the order of 0.5 to 1.0 ohm cm and thickness on the order of 1.5 to 5.0μ is formed on the substrate to provide for the P-well and N-well for the N-channel and P-channel MOS transistors. When the NPN bipolar transistor is formed in the drain of the P-channel MOS transistor, the heavily doped substrate provides a low resistance path to the collector which minimizes the switch back effect by feeding the positive power supply current from the bottom of the P-channel and bipolar transistor cell rather than from the top surface and through the epitaxial layer.

The invention and objects and features thereof will be more readily from the following detailed description and appended claims when taken with the drawing.

BRIEF DESCRIPTION OF THE DRAWINGS

FIGS. 1A, 1B are section views of compound modulated CMOS transistor structures in accordance with the prior art.

DESCRIPTION OF THE ILLUSTRATIVE EMBODIMENTS

Figure 1A:
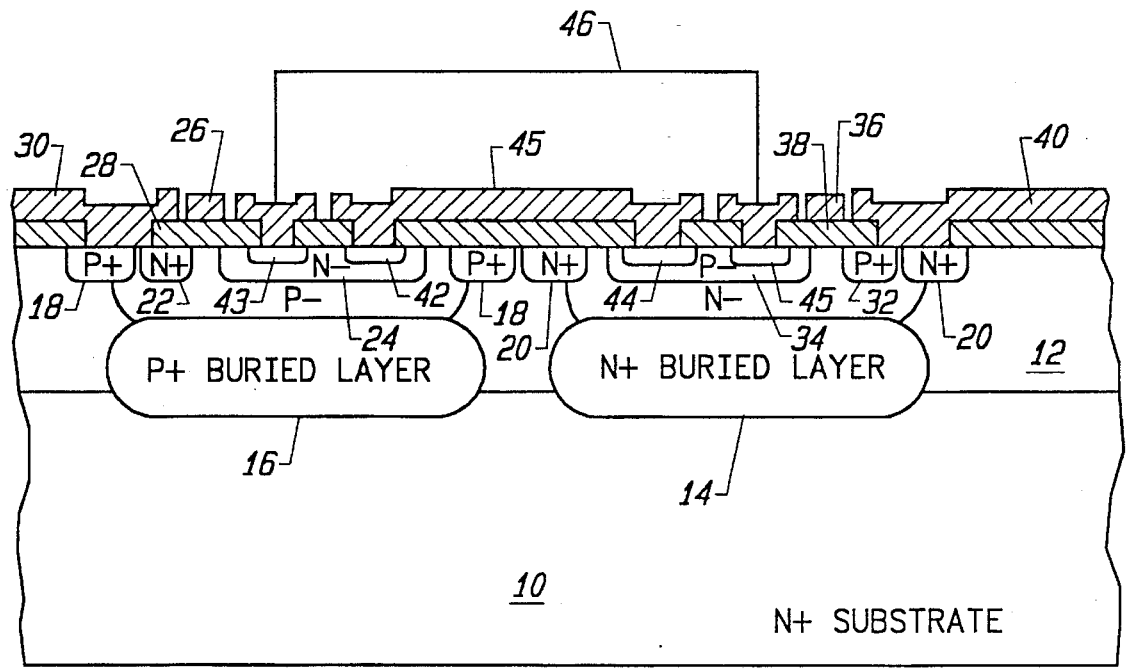
Figure 1A:
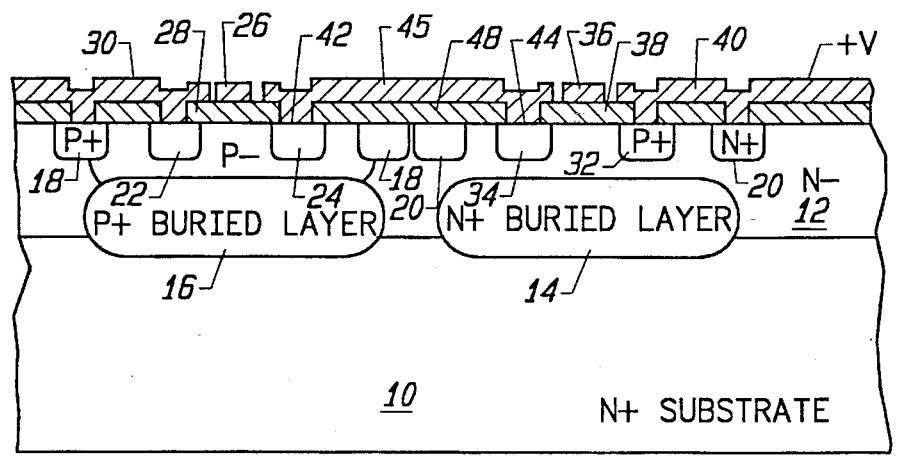

Referring now to the drawings, FIG. 1A is a section view of a compound modulated integrated transistor structure, or merged emitter BICMOS integrated structure, as disclosed in U.S. Pat. No. 5,021,858, and FIG. 1B is a section view of a similar compound modulated integrated transistor structure as disclosed in U.S. Pat. No. 4,920,399. Like elements in the two figures have the same reference numerals. In FIG. 1A an N+ substrate 10 has an N− epitaxial layer 12 formed thereon. An N+ buried layer 14 and a P+ buried layer 16 are provided at the interface of the epitaxial layer 12 and substrate 10. The portion of the N− epitaxial layer 12 above the P+ buried layer 16 is converted to P− conductivity by ion implantation. P+ regions 18 are formed at the surface of epitaxial layer 12 and define a device region above the P+ buried layer 16, and N+ regions 20 are formed on the surface of the epitaxial layer 12 above the N+ buried layer 14 and define the second device region.

An N− channel insulated gate transistor is formed in the first device region with an N+ source region 22 formed in the surface and a lighter doped N− region 24 spaced from the N− region 22 forms the drain region. A gate contact 26 is formed over an insulating layer 28 between the source 22 and drain 24. A first metallization 30 interconnects the source 22 to a −V contact.

Similarly, a P channel insulated gate transistor is fabricated in the second device region above the N+ buried layer 14 with a P+ region 32 forming the source and a lighter doped P− region 34 forming the drain. A gate contact 36 is formed over an insulating layer 38 between the source 32 and drain 34. Metallization 40 connects the source 32 with a +V contact.

As taught in U.S. Pat. No. 5,021,858, diffused regions 42 and 44 are made in the N− drain 24 and the P− drain 34, respectively, of the two transistors. The regions 42 and 44 function as emitters and form junction diodes with the drain regions, and the drain regions function as base regions in complementary bipolar transistors. Metal layer 45 interconnects regions 42 and 44 and functions as the output of the circuit. Ohmic contacts 43 and 45 are made to the base regions 24 and 34 which are interconnected by a conductor 46. The buried regions 14 and 16 form the collectors of the bipolar transistors.

Figure 2A:
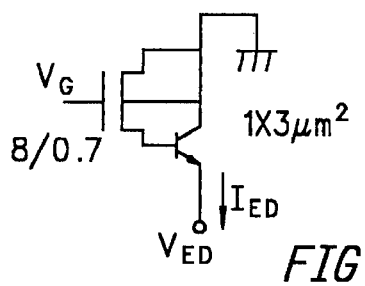
FIGS. 2A, 2B are a desired circuit schematic of an NPN transistor in the PMOS transistor and the desired I-V characteristics, respectively.
Figure 2B:
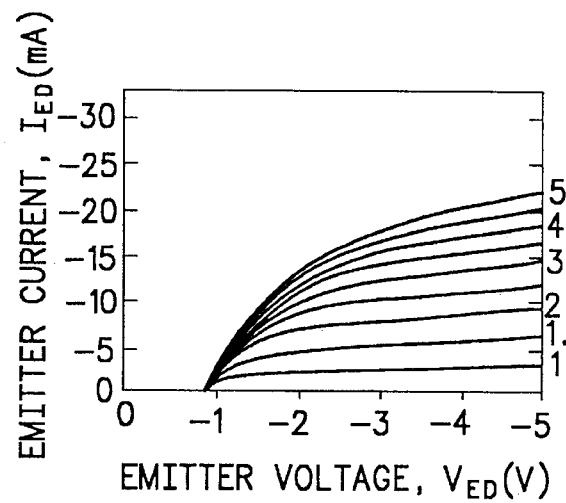

The structure of FIG. 1B is similar to the structure of FIG. 1A except that Schottky contacts 42 and 44 replace the diffused regions 42, 44 of FIG. 1A. Also, the interconnect line 46 is not employed. FIGS. 2A and 2B are an electrical schematic and desired I-V characteristic curves of the NPN bipolar transistor formed in the PMOS device structure. It will be noted that the emitter current increases uniformly with emitter voltage.

Figure 3A:
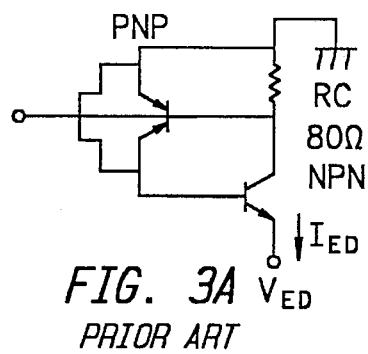
FIGS. 3A, 3B are an actual circuit schematic of the NPN transistor in the PMOS transistor of the devices of FIGS. 1A, 1B and the undesired I-V characteristics, respectively.
Figure 3B:
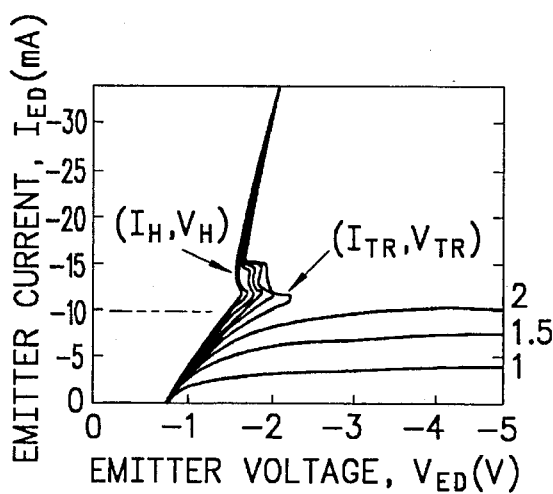

FIGS. 3A and 3B are the actual electrical schematic and I-V characteristics of the NPN transistor formed in the PMOS device in FIGS. 1A, 1B. It will be noted that a resistor RC interconnects the +V contact and the collector of the NPN transistor. This RC resistance comprises buried layer resistance, the series resistance of the epitaxial collector, and the epitaxial contact resistance between the plus voltage contact and the buried layer. When current flows from the top surface contact through the buried layer, which runs adjacent to the source 32 of the P channel MOS transistor, the resistance generates a voltage drop in the body of the MOS transistor. When this voltage drop reaches 0.55 to 0.6 volts, the source of the MOS transistor injects current into the body of the MOS transistor. This current is collected in the base of the NPN bipolar transistor and the conditions result in a four layer diode action resulting in the switch back effect illustrated in the I-V characteristics of FIG. 3B.

Figure 4A:
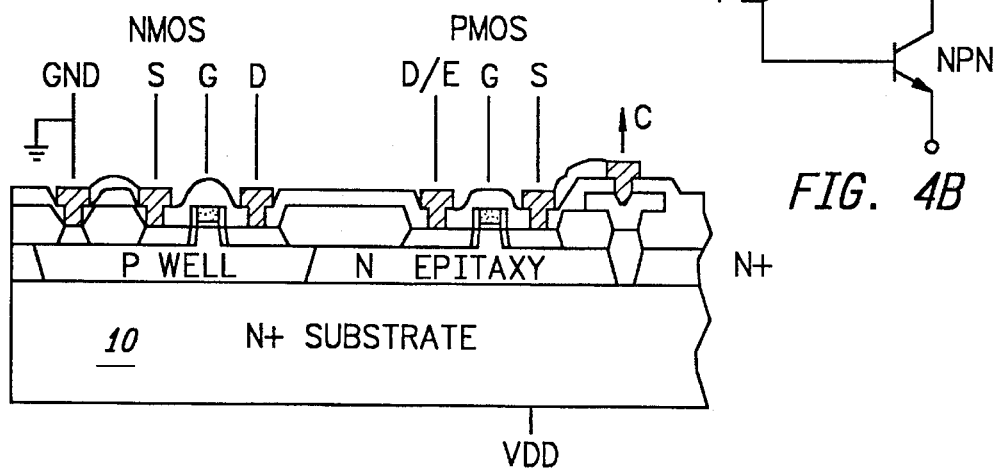
FIGS. 4A, 4B are a section view of a compound modulated CMOS transistor structure in accordance with one embodiment of the invention and the circuit schematic thereof, respectively.

FIG. 4A is a section view of a merged emitter BICMOS integrated device structure in accordance with the invention which minimizes the collector resistance by changing the path of current flow to the positive power supply and thereby eliminating the switch back effects associated with the collector resistance in FIGS. 1A, 1B. Again, like elements in FIG. 4A and FIGS. 1A, 1B have the same reference numerals. The substrate in FIG. 4A replaces the use of buried layers of FIGS. 1A, 1B and comprises a heavily doped (0.01 to 0.1 ohm cm) substrate 10 which has been doped with a slow diffusant such as antimony or arsenic or implanted with a metal such as cobalt, molybdenum, or tungsten to form a high conductivity electrode. This electrode and positive voltage contact 60 thereto supplies the positive current for the circuit cells of the integrated circuits from the back surface of the device rather than from the top surface. The epitaxial layer 12 is selectively doped and has a resistivity on the order of 0.5 to 1.0 ohm cm and a thickness of 1.5 to 5.0μ to provide for the required P-well and N-well for the N-channel and P-channel MOS transistors. The slow diffusing dopant of the substrate has limited out diffusion in to the epitaxial layer during the growth of the layer and formation of the wells therein. The use of a substrate for power distribution has been used in other applications, such as emitter coupled logic circuits, but use thereof in a merged emitter BICMOS device to eliminate the switch back effect is novel.

Figure 4B:
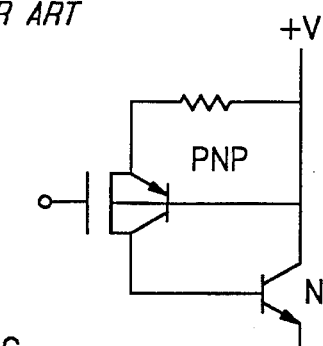

The resulting NPN bipolar transistor formed in the PMOS transistor has the equivalent circuit shown in FIG. 4B. It will be noted that the effects of the buried layer resistance have been eliminated due to the change in the current path through the substrate of the collector circuit of the NPN bipolar transistor. The body voltage of the P-channel transistor does not become more negative than the source, thus injection of current from the source into the body of the MOS transistor does not take place. This results in the elimination of the switch back effect, increasing the ruggedness of the product and reducing the sensitivity of the circuit performance to variations in the production process.

There has been described an improved compound modulated integrated transistor structure with reduced bipolar switch back effect. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A merged emitter BICMOS integrated device structure comprising
    a semiconductor body including a doped epitaxial layer on a heavier doped substrate, said substrate having a first major surface on which said epitaxial layer is formed and a second major surface opposing said first major surface,
    a P-channel field effect transistor in a first device region in said epitaxial layer and abutting a surface of said epitaxial layer,
    an N-channel field effect transistor in a second device region in said epitaxial layer and abutting said surface of said epitaxial layer, and
    a positive voltage contact on said second major surface for supplying current through said substrate to said P-channel field effect transistor whereby switch back effect in said P-channel field effect transistor is reduced.

2. The merged emitter BICMOS integrated device as defined by claim 1 wherein said positive voltage contact is on said second major surface of said substrate opposite from said surface of said epitaxial layer.

3. The merged emitter BICMOS integrated device as defined by claim 1 wherein said substrate has a resistance on the order of 0.01 to 0.1 ohm cm.

4. An integrated transistor structure comprising
    a semiconductor body having a first major surface with a first device region of a first conductivity type and a second device region of a second conductivity type therein, said semiconductor body including a heavily doped substrate of resistance on the order of 0.01 to 0.1 ohm cm, and a second major surface on said substrate,
    a first device formed in said first device region and including a source region and a drain region of said second conductivity type, said source and drain regions of said second conductivity type being spaced apart by a channel region, a gate contact between said source and drain regions of said second conductivity type and insulatively spaced from said first device region, an ohmic contact to said source region of said second conductivity type, and a junction contact to said drain region of said second conductivity type,
    a second device formed in said second device region and including a source region and a drain region of said first conductivity type, said source and drain regions of said first conductivity type being spaced apart by a channel region, a gate contact between said source and drain regions of said first conductivity type and insulatively spaced from said second device region, an ohmic contact to said source region of said first conductivity type, and a junction contact to said drain region of said first conductivity type,
    input connector means interconnecting said gate of said first device and said gate of said second device,
    output connector means interconnecting said junction contacts of said drain regions, and
    a positive voltage contact on said second major surface for supplying current through said substrate to said source region of said first device.

5. The integrated transistor structure as defined by claim 4 wherein said substrate includes slow diffusant dopants.

6. The integrated transistor structure as defined by claim 5 wherein said semiconductor body further includes an epitaxial semiconductor layer with resistance on the order of 0.5 to 1.0 ohm cm and a thickness on the order of 1.5 to 5.0 µm said device regions being formed in said epitaxial semiconductor layer.

7. The integrated transistor structure as defined by claim 6 wherein said junction contacts to said drain regions are rectifying contacts.

8. The integrated transistor structure as defined by claim 6 wherein said substrate further includes implanted metal ions selected from the group consisting of cobalt, molybdenum, and tungsten.

9. The integrated transistor structure as defined by claim 1 wherein said substrate includes implanted metal ions selected from the group consisting of cobalt, molybdenum, and tungsten.

10. The integrated transistor structure as defined by claim 1 wherein said semiconductor body further includes an epitaxial semiconductor layer with resistance on the order of 0.5 to 1.0 ohm cm and a thickness on the order of 1.5 to 5.0 µm, said device regions being formed in said epitaxial semiconductor layer.

11. The integrated transistor structure as defined by claim 10 wherein said substrate further includes implanted metal ions selected from the group consisting of cobalt, molybdenum, and tungsten.

12. The integrated transistor structure as defined by claim 1 wherein said positive voltage contact is on said second major surface beneath said first device region and said second device region.

* * * * *